United States Patent [19]

Davis

[11] 4,027,177
[45] May 31, 1977

[54] CLAMPING CIRCUIT

[75] Inventor: William F. Davis, Tempe, Ariz.

[73] Assignee: Motorola, Inc., Chicago, Ill.

[22] Filed: Aug. 5, 1976

[21] Appl. No.: 711,916

Related U.S. Application Data

[63] Continuation of Ser. No. 555,466, March 5, 1975, abandoned.

[52] U.S. Cl. .............................. 307/237; 307/354; 307/362; 307/297; 307/303; 330/30 D
[51] Int. Cl.[2] ..................... H03K 5/08; H03F 3/45; H03G 11/00; H03L 1/10
[58] Field of Search ............... 307/237, 313, 235 E, 307/235 T, 303, 297; 328/171; 330/30 D

[56] References Cited

UNITED STATES PATENTS

| | | |
|---|---|---|
| 3,610,962 | 10/1971 | Meyer et al. .................. 307/237 X |
| 3,681,623 | 8/1972 | Hoffman, Jr. et al. ............ 307/297 |
| 3,704,383 | 11/1972 | Ault et al. .......................... 307/237 |
| 3,864,584 | 2/1975 | Hutson .......................... 307/237 X |
| 3,890,634 | 6/1975 | Ruegg ............................ 307/237 X |

Primary Examiner—John S. Heyman
Assistant Examiner—Larry N. Anagnos
Attorney, Agent, or Firm—Kenneth R. Stevens

[57] ABSTRACT

A clamping circuit particularly adaptable for integrated circuits having improved low impedance characteristics. The operating characteristics of a "current-mirror" clamping circuit are improved by coupling a regenerative semiconductor feedback circuit means across the transistor and diode current-mirror circuit for increasing current flow to the semiconductor diode in response to the clamping transistor being driven to a lower impedance state by voltage changes coupled to its emitter terminal.

8 Claims, 4 Drawing Figures

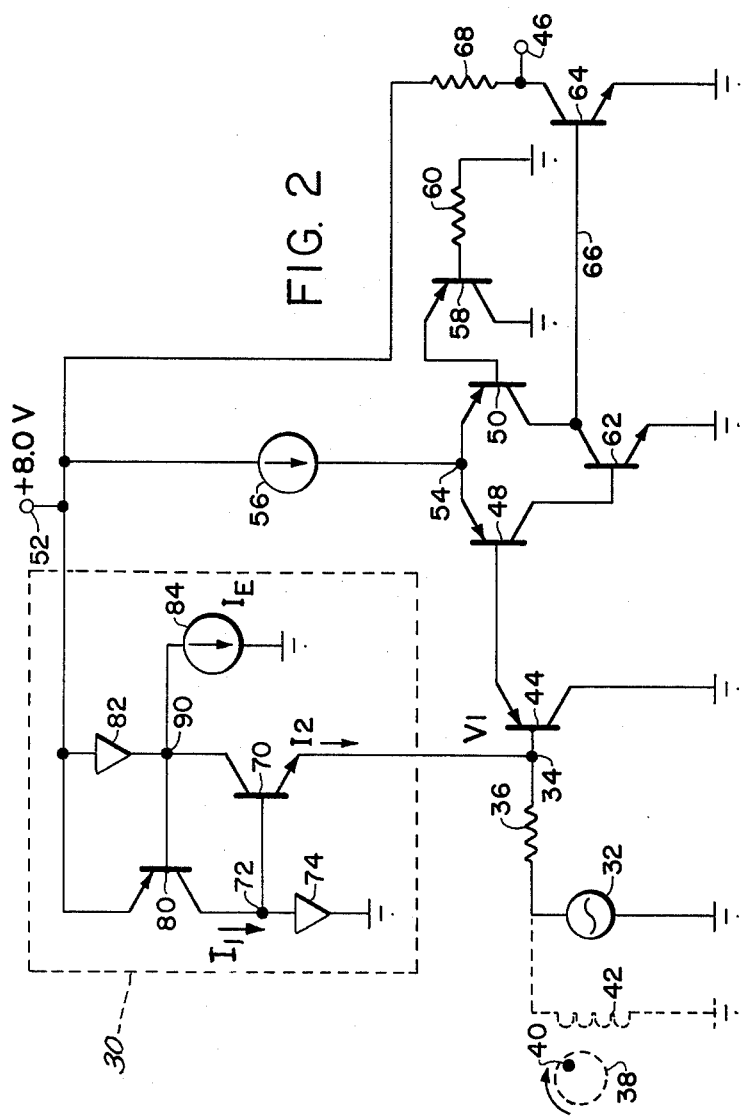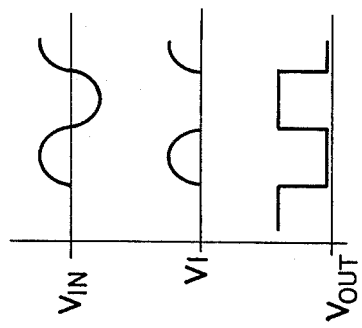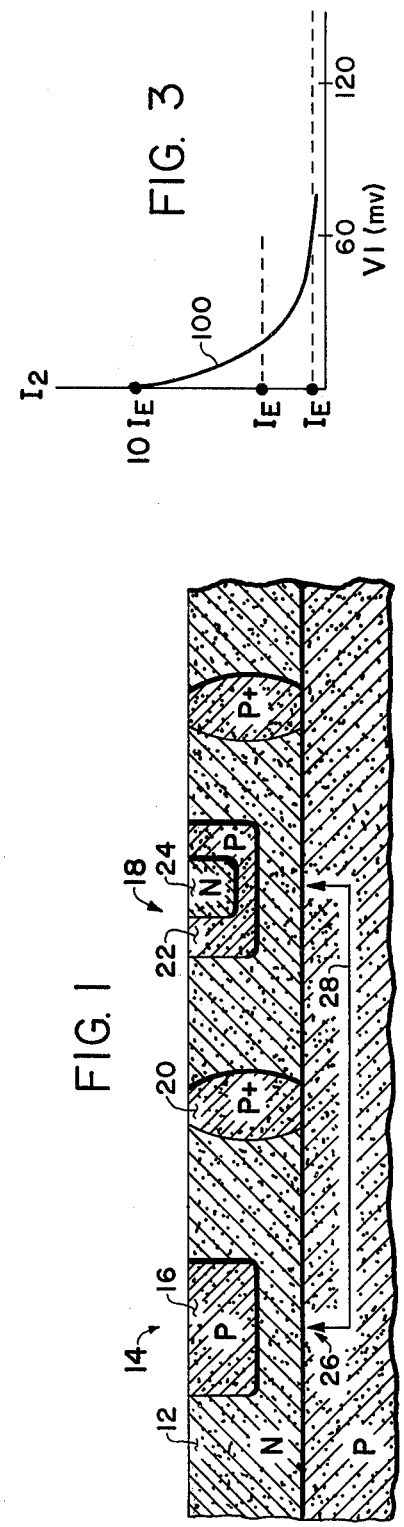

4,027,177

CLAMPING CIRCUIT

This is a continuation of application Ser. No. 555,466, filed Mar. 5, 1975, was abandoned.

BACKGROUND OF THE INVENTION

1. Field of the Invention

This invention relates to a clamping circuit and more particularly a clamping circuit for use with integrated circuits.

2. Description of the Prior Art

In the past, numerous circuit techniques have been employed for clamping purposes. A fundamental technique is to clamp a circuit node to a desired clamping voltage by means of a single diode. However, when the diode is driven to a lower impedance or higher conductive state, the forward voltage drop of the diode introduces a error signal and thus the circuit node never can be ideally clamped to ground potential.

An improvement to the diode clamp is a current-mirror clamping circuit. The emitter terminal of the transistor is coupled to the clamping node and its base terminal is connected to the anode terminal of a matching semiconductor diode. The cathode terminal of the diode is then connected to the desired clamping voltage, such as, ground potential. Assuming the clamping transistor possesses an extremely high beta, i.e., base current is negligable, essentially equal amounts of current will flow through the transistor and the semiconductor diode when the clamping node is being driven into its low impedance state. In an integrated circuit implementation the impedance characteristic of the base-to-emitter junction of the clamping transistor is identical to the diode drop impedance characteristic and thus the emitter terminal of the clamping transistor is maintained at ground potential as the voltage loop equation beginning at the cathode of the diode and down through the base emitter junction of the clamping transistor results in the emitter terminal being maintained at the same potential as the cathode terminal of the diode, or ground potential in the present example.

Notwithstanding, it can be seen for certain circuit applications the conventional current-mirror clamping circuit suffers from inherent drawbacks. For example, with an NPN clamping transistor a large negative noise spike at its emitter terminal causes substantially increased current flow through the clamping transistor without a concomitant increase of current flow through the diode. As a result, there is a more negative voltage drop across the base-to-emitter junction of the transistor than the voltage drop across the diode. Accordingly, the circuit node which is being clamped is capable of swinging below ground potential. With the current flow through the clamping transistor 10 and 100 times greater than the current flow through the diode, the emitter terminal is capable of being driven to −60 and −120 millivolts, respectively. For many circuit applications these negative excursions are not tolerable. In an integrated circuit environment, as illustrated in FIG. 1, one common integrated circuit implementation employs a starting P-type substrate 10 and an overlying N epitaxial layer 12 for both NPN and PNP transistors. A PNP transistor 14 is formed by diffusing a P-type region 16 into the N epitaxial layer 12. Similarly, the integrated circuit also contains NPN transistors schematically designated at 18 located in a P+ isolation region 20 and is formed by first diffusing a P base region 22 into the N epitaxial layer 12 in order to form a PN base collector junction. An N type region 24 is then diffused into the P region 22 in order to form the emitter of the NPN transistor 18.

In this integrated circuit environment it can be seen that if the base collector junction of PNP transistor 14 is forward biased, for example, by a large negative noise spike, carriers are injected into the P substrate at the PN junction depicted at 26. This effectively forms a lateral parasitic NPN transistor constituted by the N base region of transistor 14, the P substrate region, and the N collector region of transistor 18, as schematically depicted by solid line 28. Thus, with a large negative signal applied to PNP transistor 14 a sneak path is created to another NPN transistor located on the integrated circuit substrate. This sneak path is capable of erroneously triggering other semiconductor devices located on the circuit.

SUMMARY OF THE INVENTION

It is therefore an object of the present invention to provide a clamping circuit which possesses significantly improved characteristics in the low impedance state.

It is another object of the present invention to provide an improved clamping circuit with a very low impedance without necessitating complex circuitry such as, a negative feedback amplifier.

A further object of the present invention is to provide improved clamping circuit which is particularly adaptable for linear integrated circuits which require negative voltage transients to be clamped to ground.

In accordance with the aforementioned objects, the present invention provides a improved "current-mirror" clamping circuit which employs a regenerative semiconductor feedback circuit coupled between the coupling transistor and diode of the conventional circuit for increasing current flow to the diode in response to the clamping transistor being driven to a lower impedance state by voltage changes coupled to the emitter of the clamping transistor.

BRIEF DESCRIPTION OF THE DRAWINGS

FIG. 1 shows an integrated circuit substrate, in cross section partially broken away, and illustrates the problem of employing certain types of clamping circuits having limited low impedance characteristics for certain integrated circuit applications.

FIG. 2 is an electrical schematic diagram illustrating the improved clamping circuit of the present invention connected to an integrated circuit requiring low impedance characteristics of the present invention for optimum operation.

FIG. 3 is a graph illustrating the improved voltage current characteristics of the present invention and FIG. 4 shows voltage signal waveforms existing at various points in the circuit during overall operation.

DESCRIPTION OF THE PREFERRED EMBODIMENTS

As previously described with reference to FIG. 1, an improved clamping circuit 30 is operative to clamp input source 32 connected to node 34 via resistor 26 to ground potential. As shown in phantom and as employed in many automative applications the input source can also be constituted by a rotating member 38 having a magnetic portion 40 for generating an electromotive-force in coil 42. The clamping circuit 30 is effective to provide a clamp voltage V1 to the base terminal of PNP input transistor 44 in response to source 32 generating a volatage Vin. The voltage waveforms Vin and V1 are illustrated in FIG. 4.

The remaining portion of the circuit does not form part of the present invention but merely represents a conventional circuit which operates to provide a zero crossing detector output signal $V_{out}$, FIG. 4, at output terminal 46 in response to sinusoidal input signal $V_{in}$. The pair of PNP transistors 48 and 50 essentially form a differential pair for comparing the input signal V1 received at node 34 against ground potential. The zero reference crossing detector further includes a positive supply voltage of 8.0 volts connected to terminal 52. The differential pair of transistors 48 and 50 receive a constant current at node 54 by means of a constant current source schemtically depicted at 56. Operationally, when transistor 50 is on the PNP transistor 58 having its base terminal connected to ground potential by means of resistor 60 is responsive to maintain the base terminal of transistor 50 at approximately ground potential. An NPN transistor 62 provides a single-ended output from the differential stage and is connected to output transistor 64 by means of line 66. The collector terminal of transistor 64 is connected by means of load resistor 68 to the positive supply terminal 52.

Referring in detail to the improved clamping circuit 30, it includes an NPN clamping transistor 70 having its emitter terminal connected to node 34 and its base terminal connected to node 72. A diode 74 connects node 72 to ground potential. A regenerative feedback circuit comprises a PNP transistor 80, diode 82, and a current source 84 for delivering a current flow $I_E$ of approximately 5 microamps. The clamping circuit 30 is operative to clamp node 34 to ground potential. During clamping, currents I1 and I2 flow through diode 74 and transistor 70; with high beta transistors 70 and 80 currents I1 and I2 are essentially of equal magnitude. Thus, node 72 is one diode drop above ground potential and the base to emitter voltage drop across transistor 70 is one diode drop below ground potential and therefore the emitter terminal of transistor 70 must also be at ground potential.

Now assuming that a large negative noise spike is received at node 34, the base to emitter junction of transistor 70 becomes more heavily forward biased and thus the amount of current I2 increases. However, an increase in I2 also increases the voltage drop across diode 82 so as to make node 90 connected to the base terminal of transistor 80 more negative. The forward bias across the base-to-emitter junction of PNP transistor 80 is increased and thus the amount of collector current I1. The increased amount of current flow I1 tends to make node 72 more positive with respect to ground potential. Accordingly, the increased voltage drop across the base to emitter of transistor 70 during extremely low impedance operation if offset by the increased voltage generated at node 72. Even for an extremely high values of I2, that is, extremely low impedance operation, the clamping circuit 30 is able to maintain node 34 at ground potential.

The improved voltage-current characteristics of the clamping circuit 30 is illustrated in FIG. 3 where it is seen that even for extremely high values of I2 the voltage V1 at node 34, is slightly positive and does not extend into the negative region. In order for the clamping circuit to operate it is necessary to initially apply some base current to transistor 70 by means of current source 84. The non-ideal characteristics of curve 100 are due to the requirement of including current source 84 into the clamping circuit. Nonetheless, it can be seen that the slight distortion of the curve 100 away from an ideal situation occurs at the positive voltage side, and thus when employed to avoid the problems described with respect to FIG. 1 it is successful in eliminating parasitic transistors or sneak paths in the P substrate to other NPN transistors located on the substrate.

For example, with transistors 44 and 62 of FIG. 2 corresponding to transistors 14 and 18 of FIG. 1, respectively, clamping circuit 30 prevents the junction formed by the base N layer and collector P substrate region from becoming forward bias, i.e., below ground potential. Hence, NPN transistor 62 is not erroneously triggered due to potential sneak paths, as previously described in connection with FIG. 1. The complete integrated circuit implementation of the overall circuit of FIG. 2 has not been fully shown for ease of understanding and description, and moreover, such an implementation merely employs well-known prior art techniques.

What is claimed is:

1. An integrated circuit for preventing transient substrate current injection comprising:
   a. a semiconductor substrate of P conductivity type,
   b. a layer of N conductivity type disposed over said substrate,
   c. isolating means disposed into said layer for forming a plurality of isolated regions,
   d. first means for coupling a voltage supply of a given magnitude and polarity to said semiconductor substrate,
   e. second means coupled to at least one of said plurality of isolated regions for coupling an electrical signal thereto, said electrical signal having a magnitude and polarity capable of forward biasing the PN junction formed between said semiconductor substrate and a portion of said at least one of said plurality of isolated regions,
   f. clamping circuit means to coupled to said at least one of said plurality of isolated regions for preventing said PN junction from becoming forward biased as a result of said electrical signal, said clamping circuit means including a clamping transistor for providing a high impedance state and a low impedance state in accordance with the amount of its emitter current, semiconductor junction means having first and second terminals, a first node coupled to said first terminal and to the base terminal of said clamping transistor, said second terminal being coupled to said voltage supply, regenerative semiconductor feedback circuit means coupled between said clamping transistor collector terminal and the first node for increasing current flow at the first node in response to the clamping transistor being driven to a lower impedance state in response to said electrical signal being coupled to the emitter terminal of said clamping transistor.

2. An integrated circuit for preventing transient substrate current injection as in claim 1 wherein:
   a. said regenerative semiconductor feedback circuit means comprises a second transistor of opposite conductivity type than said first transistor for providing increased current flow at said first node in response to increased current flow through said clamping transistor.

3. An integrated circuit for preventing transient substrate current injection as in claim 2 wherein said regenerative semiconductor feedback circuit further comprises:
  a. a second node for receiving a biasing voltage,
  b. a first semiconductor diode coupled between said second node and a third node, and said third node comprising the clamping transistor collector terminal and the base terminal of said second transistor, and
  c. the emitter terminal of said second transistor being coupled to said second node and the collector terminal of said second transitor being coupled to said first node.

4. An integrated circuit for preventing transient substrate current injection as in claim 3 wherein:
  a. said semiconductor junction means comprises a second semiconductor diode coupled between said first node and said voltage supply.

5. An integrated circuit for preventing transient substrate current injection as in claim 4 wherein:
  a. said second diode constitutes a first PN junction and said clamping transistor consitutes a second PN junction between its base and emitter terminals, and
  b. said first and second PN junctions having substantially identical impedance characteristics.

6. An integrated circuit for preventing transient substrate current injection as in claim 5 wherein:
  a. said voltage supply is ground potential.

7. An integrated circuit for preventing transient substrate current injection as in claim 6 wherein a portion of said at least one of said plurality of isolated region comprises:
  a. the base region of a third input transistor coupled to the emitter terminal of said clamping transistor.

8. An integrated circuit for preventing transient substrate current injection as in claim 7 wherein:
  a. said second means is coupled to means for receiving an input signal from a rotating mechanical means.

* * * * *